Feb. 20, 1968 HANS-NORBERT TOUSSAINT 3,370,174

SEMICONDUCTOR LATCHING SWITCH WITH LIGHT-COUPLED TRIGGERING MEANS

Filed Oct. 9, 1964

United States Patent Office 3,370,174
Patented Feb. 20, 1968

1 2

3,370,174

SEMICONDUCTOR LATCHING SWITCH WITH LIGHT-COUPLED TRIGGERING MEANS

Hans-Norbert Toussaint, Munich, Germany, assignor to Siemens Aktiengesellschaft, Berlin and Munich, Germany, a corporation of Germany Filed Oct. 9, 1964, Ser. 402,724
Claims priority, application Germany, Oct. 10, 1963, S 87,803
4 Claims. (Cl. 250—211)

Figure 1:
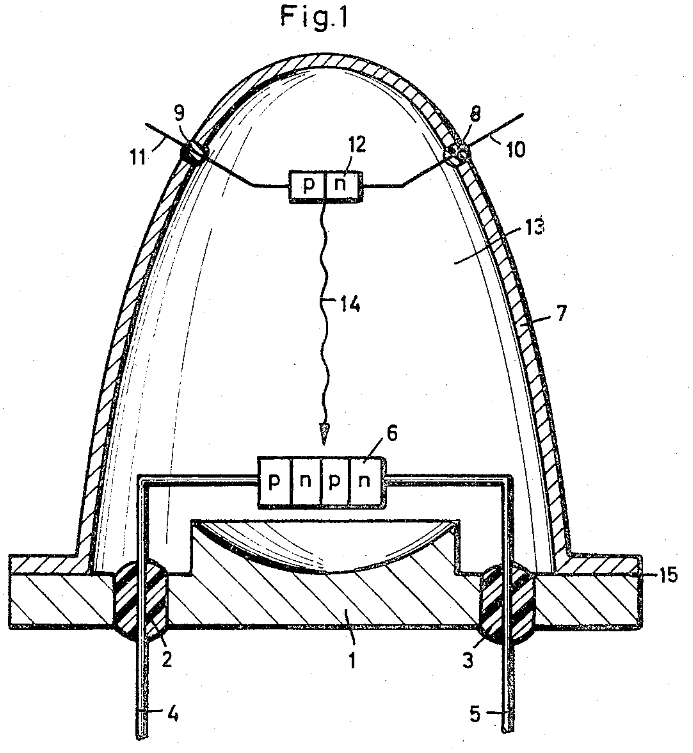

My invention relates to optically controlled semiconductor switching devices having at least four zones of alternately different conductance type.

Four-layer semiconductor switching devices of the pnpn type, having a characteristic fundamentally similar to that of the thyratron, are particularly advantageous for performing switching or triggering operations. For releasing the switching or triggering operation, the semiconductor switching device must be fired in order to obtain a breakdown of the inversely poled p-n junction. The same applies to more complicated semiconductor devices of this general type, that is, devices having more than four zones of alternately opposite types of conductance.

The breakdown of such a semiconductor switching device can be controlled by providing it with a gate electrode which acts for example upon the p-n junction which is poled in the blocking direction. The gate electrode then may serve to inject charge carriers in the vicinity of the p-n junction or may impose a capacitive control upon this junction in order to fire the device. In the latter case, the device, according to experience, is not particularly sensitive because the effect of the dielectric between the semiconductor crystal and the gate electrode causes an appreciable amount of the controlling energy to be lost, even if the dielectric consists of ferroelectric material such as barium titanate. Such a device has also been found unsuitable for achieving very short switching periods.

The provision of a carrier-injecting gate electrode affords attaining a higher sensitivity of control. However, since with such a device the firing circuit is galvanically coupled through the semiconductor crystal with the secondary load circuit to be switched, the improvement in sensitivity is accompanied by serious shortcomings. Above all, the galvanic coupling between the primary firing circuit and the secondary load circuit becomes troublesome in relatively simple circuit connections, for example in bridge networks equipped with such switching diodes or thyristors. To avoid the trouble, complicated and expensive circuitry has heretofore been necessary, resulting in a considerable increase in cost.

It is an object of my invention to eliminate or greatly minimize the above-described disadvantages in the operation of semiconductor switching devices.

More specifically, it is an object of the invention to provide a semiconductor switching device of the thyristor type which combines high sensitivity of response to control signals with a particularly short switching time. Another object is to provide a device which attains the just mentioned objects with the aid of simple circuitry and affords a galvanic isolation between the controlling or firing circuit and the load circuit being controlled.

To achieve these objects, the invention takes advantage of the known fact that semiconductor junction-type devices are sensitive to electromagnetic radiation. This radiation sensitivity permits applying an optical control by light signals, such as light pulses. However, since the conventional light sources, such as incandescent or glow lamps, are relatively sluggish and therefore involve considerable switching delays and hence long effective switching periods, I provide according to the invention, a controlling light source which is constituted by a radiation emitting semiconductor member such as a luminescent junction diode or a laser diode which is connected into a primary or trigger circuit for firing the semiconductor switching device proper. The excitation of the emissive semiconductor member and thus the stimulation of radiation from the member onto the semiconductor switching device to be fired, is effected by passing an electrical current of the required intensity through the emissive member.

The emissive semiconductor member and the switching device to be fired thereby, the latter being for example a diode of the pnpn type, are mounted in an enclosed and preferably radiation-impermeable housing in fixed proximity to each other so that the radiation beam issuing from the controlling member is directed onto the switching device for optically triggering said switching device. The fixed mounting of the emissive member and of the switching device provides for a precisely defined optical coupling between the two components as well as for maximal sensitivity, particularly if the two components are mounted as close to each other as feasible.

While reference is made in the foregoing to optical control and the emission of light from the emissive semiconductor member, it will be understood that these terms are intended to also relate to electromagnetic radiation in the invisible regions of the spectrum, for example to infrared radiation. The use of a housing or encapsulation having walls of material impermeable to the radiation emitted from the emissive member is not necessary if this radiation occurs only to a negligible extent in ordinary daylight or in the light of conventional artificial light sources and if the sensitivity of the semiconductor switching device being controlled with respect to other radiation frequency is greatly reduced either due to the inherent characteristic of the switching device or by other known means.

Semiconductor members for emitting the controlling radiation in a device according to the invention are preferably luminescent diodes or laser diodes at whose p-n junction the required radiation is generated or stimulated. When such emission diodes are biased or poled in the forward direction, they issue light quanta under the effect of the applied voltage or current. By suitably adapting the intensity of this radiation to the sensitivity of the pnpn switching device, the occurrence of such emission has the effect of triggering the switching device from nonconductive to conductive condition. The main advantage of such emissive or emission diodes is the fact that they operate virtually without inertia so that the number of photons emitted per unit time is, with great precision, proportional to the current flowing through the emission diode. It is thus possible, for example, to switch the pnpn semiconductor device at a frequency in the order of magnitude of a few megacycles per second.

Figure 2:
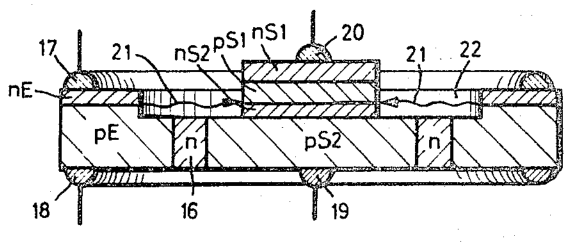

The above-mentioned and further objects, advantages and features of my invention, said features being set forth with particularity in the claims annexed hereto, will be apparent from, and will be described in, the following with reference to embodiments of semiconductor switching devices according to the invention illustrated by way of example in the accompanying drawing, in which:

FIG. 1 is a schematic view, partly in section, of an embodiment of the semiconductor switching device of the present invention; and FIG. 2 is a schematic view, in section, of another embodiment of the invention, with the appertaining encapsulation omitted.

The device illustrated in FIG. 1 comprises a housing having a base plate 1 and bell-shaped cover 7. The housing is traversed at four places by sealed-in leads. If the housing comprises metal, as is the case in the illustrated embodiment, at least three of the leads are insulated from the housing. Thus, two insulating seals 2 and 3 in the base plate 1 are traversed by respective leads 4 and 5 which are thus insulated from the base plate. Two other insulating sealing plugs 8 and 9 are provided in the cover 7 and are traversed by respective leads 10 and 11.

A pnpn switching diode 6 is connected between the inner ends of the leads 4 and 5. An emission diode 12 is connected between the inner ends of the leads 10 and 11. The p-n junction of the emission diode 12 is positioned or oriented so that the area where this junction emerges at the semi-conductor surface of said diode, and from which the beam of radiation issues when said diode is excited, is directed toward the semiconductor switching diode 6. The distance between the switching diode 6 and the emission diode 12 is determined by the voltage difference permissible between these two semiconductor components. In practice, a distance of about 1 cm. is sufficient. In most cases, the semiconductor components 6 and 12 may be combined in a single semi-conductor body, as hereinafter described with reference to FIG. 2.

In order to secure with this mutual spacing an effective optical coupling between the two semiconductor components 6 and 12, and in accordance with another feature of my invention, it is preferable to provide the space 13, which is formed by the bell-shaped cover 7 and the base plate 1 of the housing, in the approximate shape of an ellipsoid and to mount the emission diode 12 at one focal point of the ellipsoid and the switching diode 6 at the other focal point of the ellipsoid. It is also preferable to provide the base plate 1 and the cover 7 with respective inner surfaces which are well reflective with respect to the radiation 14 issuing from the emission diode 12.

After the switching diode 6 is assembled with the bottom plate 1 and the emission diode 12 is assembled with the cover 7, the cover 7 and the base plate 1 are joined with each other at the lip, rim or edge 15 in known manner, for example by welding, soldering, cold welding or thermocompression.

The radiataion from the emission diode 12 must be such as to release free charge carriers in the semiconductor material of the pnpn switching diode 6. For this purpose, it is particularly desirable to make the switching diode 6 of a semiconductor material having a forbidden bandwidth adapted to that of the semiconductor material from which the emission diode 12 is formed. Consequently, it is preferable that the energy of the radiation issuing from the emission diode 12 be greater than the amount of energy corresponding to the forbidden bandwidth of its semiconductor material. For the same reason, it is also of advantage to have the semiconductor material of the emission diode 12 possess a width of the forbidden band which is equal to or larger than the width of the forbidden band of the semiconductor material of the pnpn switching diode 6. As a rule, the desired effect is invariably achieved by making the emission diode 12 and the pnpn switching diode 6 of the same semiconductor material. Thus, for example, the emission diode 12 and the pnpn switching diode 6 may consist of gallium arsenide. Since the width of the forbidden band of gallium arsenide is larger than that of germanium and silicon, the emission diode 12 may consist of gallium arsenide when the switching diode 6 consists of germanium or silicon, because the frequency of the radiation issuing from the gallium arsenide diode is in any event capable of firing the breakdown of germanium or silicon pnpn diodes.

The emission diode 12 may also be made of gallium phosphide, for example a mixed crystal of gallium phosphide and gallium arsenide. A suitable composition is GaAsP. The pnpn switching diode 6 in this case may likewise consist of gallium phosphide or said mixed crystal, or it may consist of silicon or germanium. Since the properties of the available semiconductor materials are well known, suitable combinations are readily available.

It is preferable to employ as the emissive diode 12 a laser diode because it issues a monochromatic beam of well defined shape and thus achieves a particularly good optical coupling with the switching diode 6. A suitable laser diode, for example, is the known gallium arsenide laser. Such lasers are described for example in the article series entitled "Injection Lasers" in the periodical Electronics of Dec. 6, 1963, page 61, published by McGraw-Hill, and in the periodical Electronics of Dec. 13, 1963, page 34, published by McGraw-Hill.

As aforementioned, a good optical coupling is secured particularly by combining the emissive diode 12 and the pnpn diode 6 in a single semiconductor body. The embodiment shown in FIG. 2 is of this type. For mutually isolating the two semiconductor components thus combined in a single semiconductor body, it is necessary to provide so-called "isolating" p-n junctions in order to prevent current flow from the semiconductor portion that constitutes the pnpn diode to the portion that forms the emission diode. Employment of so-called hertero-pn junctions provides a particularly favorable absorption of the radiation issuing from the emission diode by the semiconductor portion that constitutes the pnpn diode.

The composite device shown in FIG. 2 is axially symmetrical and essentially comprises a substantially circular disc structure which is mounted in a housing or other encapsulation (not shown in FIG. 2). The portion forming the switching diode is positioned at the center of the base of the device and comprises the zones nS1, pS1, nS2 and pS2, as well as two electrodes 20 and 19 which form barrier-free contacts with the two outer zones nS1 and pS2. The switching diode portion of the device is coaxially surrounded by a ring-shaped portion which forms the emission diode, in this case designed as a laser diode. The laser diode portion comprises the zones nE and pE as well as two electrodes 17 and 18 which are ring-shaped and are in contact with these two zones, respectively.

Ring-shaped p-n isolating junctions are formed in the semiconductor body between the switching diode portion and the emission diode portion for electrically isolating them from each other. These isolating p-n junctions are produced by doping respective n-type zones 16 into the semiconductor body so that these ring-shaped zones are located between the two p-types zones pE and pS2 and completely separate the p-type zones from each other.

The arrangement of the p-n junction between the zones pS1 and nS2 of the switching diode, which in the switching diode is inversely biased when the device is under load, is such that radiation 21 from the p-n junction between the zones nE and pE of the emission diode can reach the pS1–nS2 junction in full force on the shortest possible path. The design of the semiconductor body shown in FIG. 2 is particularly adapted to the latter purpose, particularly by providing it with an annular groove 22 between the p-n junctions of the switching diode on the one hand and the emission diode on the other hand.

The semiconductor device shown in FIG. 2 may consist entirely of the same fundamental semiconductor material, such as gallium arsenide or the other semiconductor substances hereinbefore mentioned, in which the afore-described different zones are produced by doping. However, the switching diode portion on the one hand and the emission diode on the other hand may also be formed of respectively different semiconductor material bonded or joined together in any suitable manner.

To those skilled in the art it will be obvious upon a study of this disclosure that my invention permits of various modifications with respect to design, arrangement, materials and circuitry of the components and hence can be given embodiments other than particularly illustrated and described herein, without departing from the essential features of my invention and within the scope of the claims annexed hereto.

I claim:

1. A semiconductor switching device, comprising a single semiconductor body integrally comprising an optically controllable switching diode having four zones of alternately different conductivity type forming p-n junctions between adjacent ones thereof and a radiation emissive emission diode semiconductor member which emits radiation when excited by electrical current, said radiation emissive diode member being integrally formed with and in proximity with said switching diode and spaced from said switching diode by a space and having a p-n junction and an emission beam axis issuing from the p-n junction of said radiation emissive member and directed onto said switching diode for optically triggering said switching diode upon excitation of said radiation emissive member by electrical current, said radiation emissive member being of substantially annular configuration and coaxially surrounding said switching diode in a manner whereby radiation issuing from said radiation emissive member passes through the space between said switching diode and said radiation emissive member to a p-n junction of said switching diode, said semiconductor body including isolating p-n junctions positioned between said switching diode and said radiation emissive member and electrically separating said switching diode from said radiation emissive member;

biasing means for biasing a p-n junction of said switching diode in the blocking direction;

control circuit leads connected to said radiation emissive member for exciting said radiation emissive member with electrical current; and load circuit leads connected to said switching diode.

2. A semiconductor switching device as claimed in claim 1, wherein said isolating p-n junction are of annular configuration.

3. A semiconductor switching device as claimed in claim 1, wherein the space between said switching diode and said radiation emissive member is of annular configuration.

4. A semiconductor switching device as claimed in claim 1, wherein said radiation emissive emission diode comprises a laser diode.

References Cited

UNITED STATES PATENTS

| | | | |
|---|---|---|---|
| 3,043,959 | 7/1962 | Diemer | 250—211 |
| 3,096,442 | 7/1963 | Stewart | 307—88.5 |
| 3,192,387 | 6/1965 | Goodman | 250—217 |

RALPH G. NILSON, *Primary Examiner.*

J. D. WALL, T. N. GRIGSBY, *Assistant Examiners.*